(12) United States Patent
Wang

(10) Patent No.: US 6,848,913 B2
(45) Date of Patent: Feb. 1, 2005

(54) INTEGRATED DEVICE ELECTRONICS CONNECTOR

(75) Inventor: Hong-Chuan Wang, Taipei (TW)

(73) Assignee: EPO Science & Technology Inc., Taipei (TW)

( * ) Notice: Subject to any disclaimer, the term of this patent is extended or adjusted under 35 U.S.C. 154(b) by 0 days.

(21) Appl. No.: 10/379,668

(22) Filed: Mar. 6, 2003

(65) Prior Publication Data

US 2004/0175965 A1 Sep. 9, 2004

(51) Int. Cl.⁷ ........................ H01R 12/00; H01R 12/16; H05K 1/00
(52) U.S. Cl. ............................ 439/65; 439/61; 361/788
(58) Field of Search ..................... 439/61, 65; 361/788, 361/735, 790

(56) References Cited

U.S. PATENT DOCUMENTS

| | | | | |
|---|---|---|---|---|
| 5,926,378 A | * | 7/1999 | DeWitt et al. | 361/788 |
| 6,155,842 A | * | 12/2000 | Baitz | 439/61 |
| 6,533,587 B1 | * | 3/2003 | Potter et al. | 439/65 |

* cited by examiner

*Primary Examiner*—Chandrika Prasad
(74) *Attorney, Agent, or Firm*—Troxell Law Office PLLC

(57) ABSTRACT

An IDE connector with opposite male plug and female socket includes a circuit board with a control circuit, a chip, a male plug and a female socket. The male plug is joined to one side of the circuit and the female socket is joined to another side of the circuit board so as to be disposed oppositely. The female socket is connected to the male plug of an IDE device to enhance the data transmission quality between two IDE devices and decrease using of the flexible flat cable.

1 Claim, 2 Drawing Sheets

INTEGRATED DEVICE ELECTRONICS CONNECTOR

BACKGROUND OF THE INVENTION

1. Field of the Invention

The present invention relates to a connector between electrical devices and particularly to a connector between IDE devices.

2. Description of Related Art

Referring to FIG. 1, data transmission between two IDE (integrated device electronics) devices 10, 20 usually needs two flexible flat cable 31, 32 and each of the two flexible flat cables 31, 32 is connected to an IDE connector 40 or a main frame of a personal computer and the data transmission between the two IDE devices 10, 20 is controlled by the IDE connector 40 or the main frame.

Referring to FIG. 2, the IDE connector 40 includes a circuit board 41 associated with control circuit, a chip 42, two male plugs 43, 44. It can be seen in FIG. 1 that the two male plugs 43, 44 are connected to a respective female socket of two flexible flat cables 31, 32 and the other female socket at another end of the respective flexible flat cable 31, 32 is connected to a respective male plug of the two IDE devices 10, 20 such that the two IDE devices 10, 20 can be connected to the IDE connectors 40 respectively and the data transmission between the two IDE devices 10, 20 can be controlled by the IDE connector 40.

SUMMARY OF THE INVENTION

The crux of the present invention is to enhance quality of the data transmission between two IDE devices and to decrease the number of the flexible flat cable being used.

Accordingly, a primary object of the present invention is to provide an IDE connector with opposite male plug and female socket with which the quality of the data transmission between two IDE devices can be enhanced and the number of the flexible flat cable used can be decreased effectively.

BRIEF DESCRIPTION OF THE DRAWINGS

The present invention can be more fully understood by reference to the following description and accompanying drawing, in which.

DETAILED DESCRIPTION OF THE PREFERRED EMBODIMENT

Figure 3:
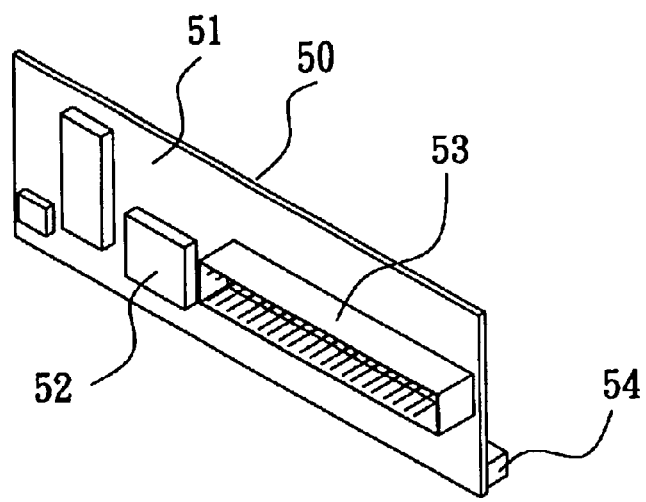
FIG. 3 is a perspective view of an IDE connector according to the present invention.

Referring to FIG. 3, an IDE connector 50 according to the present invention includes a circuit board 51 associated with control circuit, a chip 52, a male plug 53 and a female socket 54. The IDE connector 50 of the present invention is different from the conventional IDE connector 40 in that the IDE connector 50 of the present invention has a female socket 54 being disposed at one side of the circuit board 51 and the male plug 53 is disposed at another side of the circuit board 51. Hence, the male plug 53 is opposite to the female socket 54.

Figure 1:
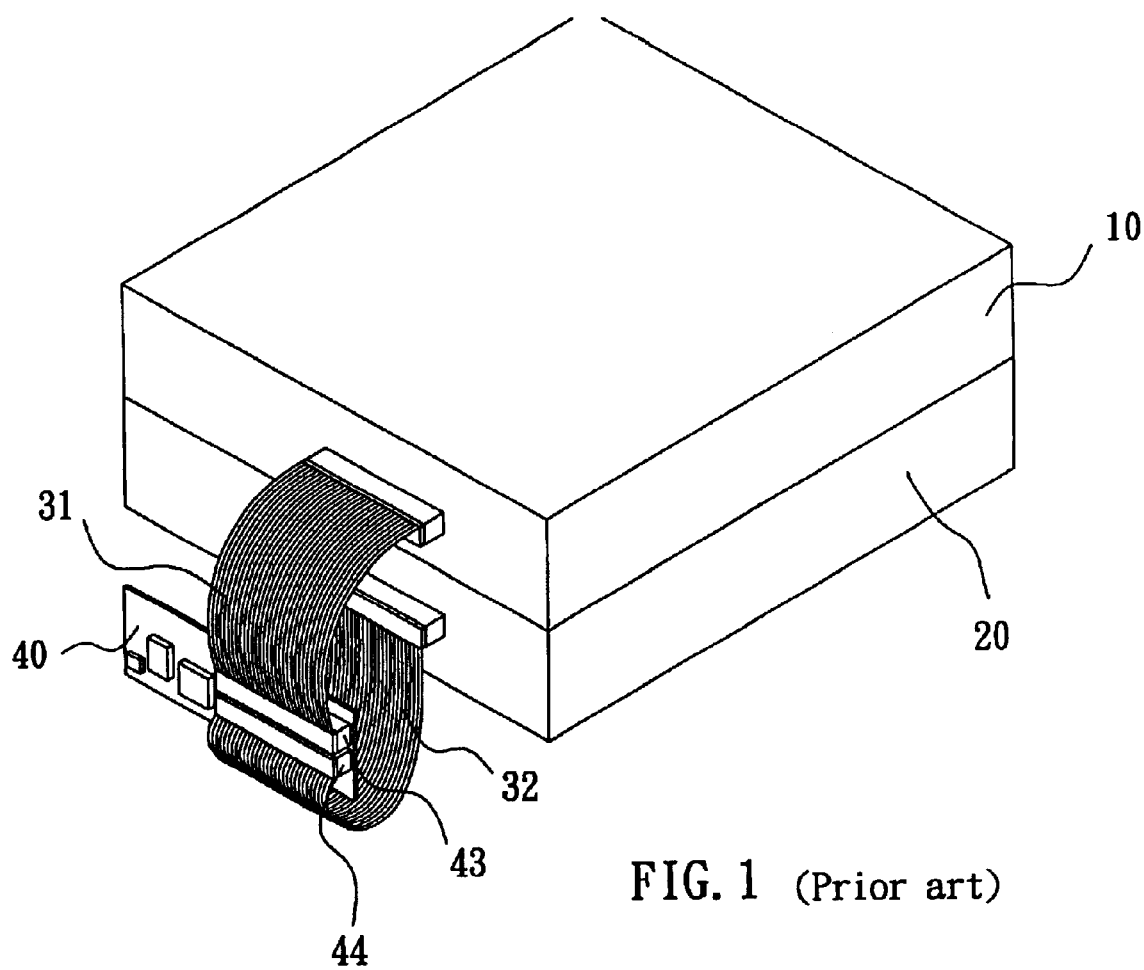
FIG. 1 is a perspective view illustrating a conventional IDE connector connecting with two IDE devices.
Figure 2:
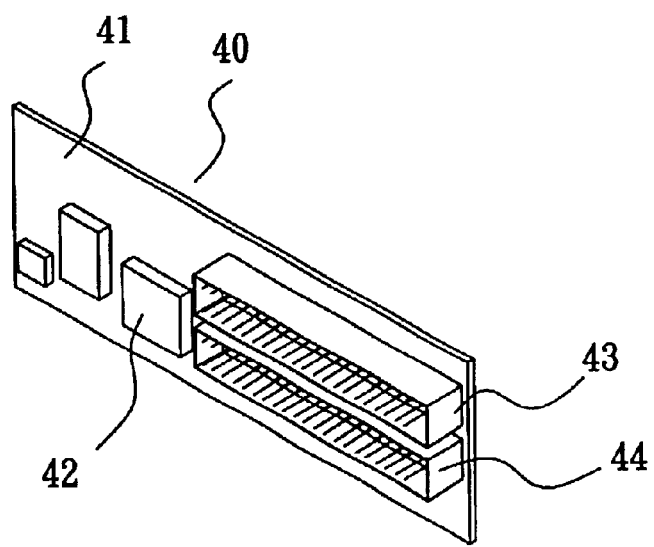
FIG. 2 is a perspective view of the conventional IDE connector shown in FIG. 1.
Figure 4:
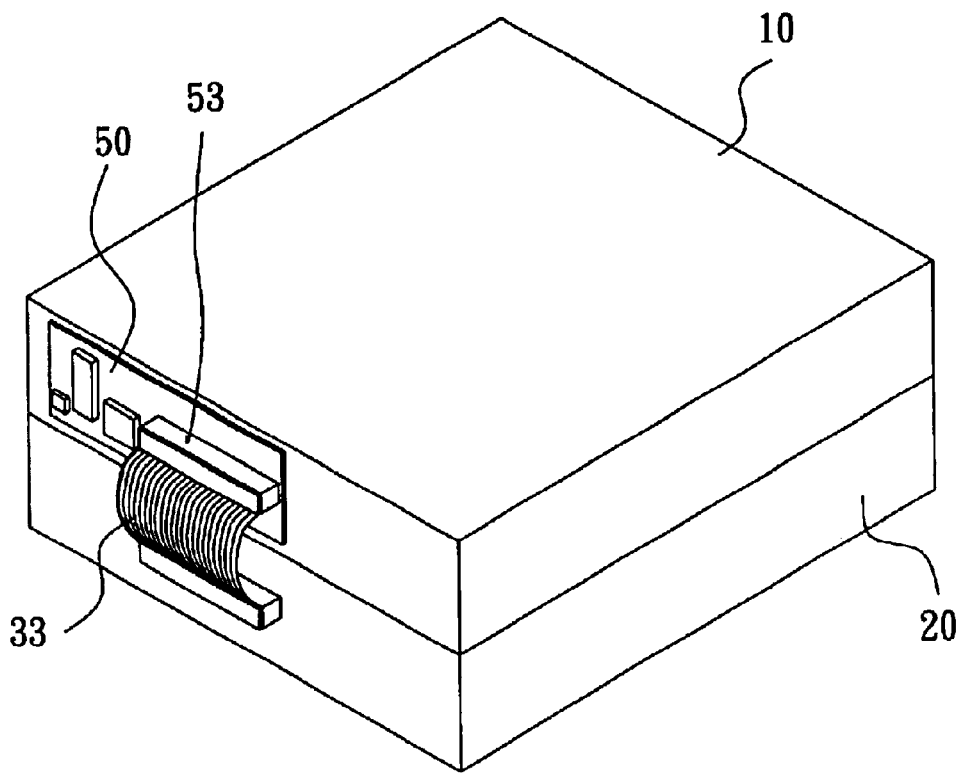
FIG. 4 is a perspective view illustrating the IDE connector of the present invention.

Referring to FIG. 4 in company with FIG. 3, The IDE connector 50 of the present invention at the female socket 54 can be connected to the male plug of an IDE device 10 so that the IDE connector 50 can connect with the IDE device 10 directly instead of using the flexible flat cable as shown in FIG. 1. The male plug 53 is connected to a female socket at an end of the flexible flat cable 33 and another female socket at another end of the flexible flat cable 33 is connected to a male plug of another IDE device 20 such that the two IDE devices 10, 20 are able to join with the IDE connector 50 and the IDE connector 50 controls data transmission between the two IDE devices 10, 20.

It is appreciated that the IDE connector 50 of present invention is utilized to connect with the IDE device 10 directly so that it is possible to save a flexible flat cable and a room for the flexible flat cable. Further, it is possible to shorten the transmission distance between the two IDE devices 10, 20 largely due to the flexible flat cable being not in use so that it is capable of reducing the chance of the signal decay greatly during the signal being transmitted in the flexible flat cable. Therefore, the quality of data transmission between two IDE devices can be enhanced significantly.

While the invention has been described with reference to a preferred embodiment thereof, it is to be understood that modifications or variations may be easily made without departing from the spirit of this invention, which is defined by the appended claims.

What is claimed is:

1. An integrated device electronics (IDE) connector for connecting two IDE devices comprising:

a) a circuit board having a control circuit;

b) a chip located on the circuit board;

c) a male plug located on the circuit board;

d) a first female socket located on the circuit board, the first female socket and the male plug being located on opposite sides of the circuit board; and e) a flexible flat cable having second and third female sockets;

wherein the first female socket is removably connected to a first connector located on an exterior of a first of the two IDE devices, the second female socket is removably connected to the male plug, and the third female socket is removably connected to a second connector located on an exterior of a second of the two IDE devices.

* * * * *